US012772394B2

(12) United States Patent
Shih

(10) Patent No.: US 12,772,394 B2
(45) Date of Patent: Oct. 20, 2026

(54) REVERSIBLE CHASSIS AND CABINET

(71) Applicant: Fulian Precision Electronics (Tianjin) Co., LTD., Tianjin (CN)

(72) Inventor: Tung-Ho Shih, New Taipei (TW)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 71 days.

(21) Appl. No.: 18/923,948

(22) Filed: Oct. 23, 2024

(65) Prior Publication Data

US 2026/0059674 A1 Feb. 26, 2026

(30) Foreign Application Priority Data

Aug. 21, 2024 (CN) ......................... 202411152478.6

(51) Int. Cl.
*H05K 5/02* (2006.01)

(52) U.S. Cl.
CPC .................................. *H05K 5/0217* (2013.01)

(58) Field of Classification Search
CPC .. H05K 5/0217; H05K 7/1488; H05K 9/0062; H05K 7/14; H05K 7/14325; H05K 7/18; H05K 7/20536
See application file for complete search history.

(56) References Cited

U.S. PATENT DOCUMENTS

2020/0100383 A1* 3/2020 Hershey ............... H05K 9/0062

FOREIGN PATENT DOCUMENTS

CN 2690232 Y 4/2005
CN 104063011 A 9/2014

* cited by examiner

*Primary Examiner* — Robin J Mishler
(74) *Attorney, Agent, or Firm* — ScienBiziP, P.C.

(57) ABSTRACT

A reversible chassis includes an inner frame and an outer frame. The inner frame is used to set electronic equipment; the outer frame is set outside the inner frame, and the outer frame is used to be movably set in a cabinet in a predetermined direction. The inner frame is provided with a rotating member on the outer side of the inner frame, and the outer frame is provided with a recessed structure on the inner side of the outer frame, and a portion of the rotating member can be rotatably accommodated in the recessed structure, so that the inner frame can be flipped relative to the outer frame. The reversible chassis provided by the present application has the advantages of simplifying the maintenance operation process and saving time and labor. The present application also provides a cabinet.

18 Claims, 8 Drawing Sheets

REVERSIBLE CHASSIS AND CABINET

FIELD

The subject matter relates to the technical field of cabinet cabinets, and in particular to reversible chassis and cabinet.

BACKGROUND

Cabinet chassis are used to provide physical protection for internal hardware components from external damages. Existing chassis are installed in cabinets in such a way that when maintenance is required on the internal hardware components, it can only be performed from the front of the cabinet. When the back of the internal hardware components need to be maintained, the chassis needs to be removed from the cabinet. These operations are cumbersome and time-consuming, and may cause chassis collision damages when removing and returning the chassis to the cabinet, thereby increasing the risk of cabinet failure.

SUMMARY

In view of this, it is necessary to provide a reversible chassis which is capable of being reversed, which is conducive to simplifying the maintenance operation process and saving time and labor.

Alternatively, the present application provides a cabinet that includes the aforementioned reversible chassis.

A reversible chassis includes an inner frame and an outer frame. The inner frame configured for setting up an electronic device. The outer frame socketed outside the inner frame, the outer frame configured for being movably disposed in a cabinet in a predetermined direction. The inner frame is provided with a plurality of rotating members on an outer side of the inner frame, the outer frame is provided with a recessed structure on an inner side of the outer frame, and a portion of the plurality of rotating members rotatable accommodated in the recessed structure, the inner frame is capable of flipping relative to the outer frame.

In some possible embodiments, the inner frame includes a first inner end plate, a second inner end plate, a first inner side plate, and a second inner side plate. The first inner end plate and the second inner end plate are arranged at intervals, the first inner side plate and the second inner side plate are arranged at intervals. The first inner side plate is disposed between the first inner end plate and the second inner side plate, the first inner side plate is connected to the first inner end plate and the second inner side plate. The second inner side plate is disposed between the first inner end plate and the second inner end plate, the second inner side plate is disposed between the first inner end plate and the second inner end plate. The first inner end plate, the first inner side plate, the second inner end plate and the second inner side plate are collectively enclosed to form a first accommodation space, the first accommodation space is configured for setting up the electronic device.

In some possible embodiments, the outer frame includes a first outer end plate, a second outer end plate, a first outer side plate, and a second outer side plate. The first outer end plate and the second outer end plate are arranged at intervals, the first outer side plate and the second outer side plate are arranged at intervals. The first outer side plate is disposed between the first outer end plate and the second outer side plate, the first outer side plate is connected to the first outer end plate and the second outer side plate. The second outer side plate is disposed between the first outer end plate and the second outer side plate, the second outer side plate is connected to the first outer end plate and the second outer side plate. The first outer end plate, the first outer side plate, the second outer end plate, and the second outer side plate are collectively enclosed to form a second accommodation space, the second accommodation space is configured for providing the inner frame.

In some possible embodiments, the rotating member includes a first bearing and a first rotating shaft. The first bearing is disposed on a side of the first inner end plate towards the first accommodation space. An end of the first rotating shaft is inserted into the first bearing, another end of the first rotating shaft is rotatably accommodated through the first inner end plate. The recessed structure includes a recess, the recess is disposed on a side of the first outer end plate side toward the second accommodation space, another end of the first rotating shaft is rotatably accommodated in the recess.

In some possible embodiments, the rotating member further includes an anti-release screw and a limiting portion. The limiting portion is rotatably socketed on another end of the first rotating shaft, the anti-release screw is provided on an end face of the first rotating shaft. The anti-release screw is configured for holding the limiting portion against the limiting portion, to prevent the limiting portion from disengaging from the first rotating shaft. The limiting portion is provided with a groove, the groove is configured for enabling the limit portion to be seated in the recess.

In some possible embodiments, the first outer end plate is movably coupled to the first outer side plate and the second outer side plate along the predetermined direction.

In some possible embodiments, each of the first outer side panel and the second outer side panel is provided with a guide block, and the first outer end panel is provided with a guide post at each end, and the guide post is movably provided in the guide block along the predetermined direction.

In some possible embodiments, the rotating member further includes a second bearing and a second rotating shaft. The second bearing is provided on a side of the second inner end plate towards the first accommodation space. Along the predetermined direction, the second bearing corresponding to the first bearing, an end of the second rotating shaft is inserted into the second bearing, another end of the second rotating shaft is rotatably accommodating the second inner end plate. Along the predetermined direction, the first rotating shaft corresponding to the second rotating shaft. The recessed structure further includes an aperture, the aperture penetrates the second outer end plate, another end of the second rotating shaft is rotatably accommodated in the aperture.

In some possible embodiments, the first inner end plate is provided with a limiting post on a side back from the first accommodation space, the limiting post and the first rotating shaft are arranged at intervals. The first outer end plate is provided with two limiting grooves on the side towards the second accommodation space, the two limiting grooves are configured for holding the limiting post with a catch, thereby limiting an angle of reversal of the inner frame with respect to the outer frame.

In some possible embodiments, the recess is located at the midpoint of two the limiting grooves, and the two the limiting grooves are configured for limiting a flip angle of the inner frame with respect to the outer frame to be 0 degrees to 180 degrees.

In some possible embodiments, the first outer side panel and the second outer side panel are each provided with a snap fastener on a side towards the second accommodation space, the snap fastener is configured for holding the first inner side panel and the second inner side panel.

In some possible embodiments, the first outer side panel and the second outer side panel are each provided with a sliding member on a side back from the second accommodation space, the sliding member is configured for connecting the cabinet.

A cabinet includes a cabinet and a plurality of chassis as described above, the cabinet includes a plurality of mounting positions, each the mounting position being provided with a connector, each the chassis being provided in one the mounting position, the connector being for connecting the electronic equipment within the chassis.

Aa rotating member in the inner frame, a recessed structure in the outer frame, and the rotating member is rotatably configured in the recessed structure, so that the inner frame can be flipped relative to the outer frame, thereby eliminating the need to remove the entire reversible chassis from the cabinet, simplifying the maintenance operation process, saving time and manpower, and also reducing the risk of collision damage due to removing and placing it back, so as to increase the efficiency and safety of the maintenance of the cabinet.

DETAILED DESCRIPTION

The following specific embodiments are exemplary and not limiting, and are intended to provide a basic understanding of the present application, and are not intended to identify key or decisive elements of the present application or to limit the scope of protection sought. As long as there is no structural conflict, each of the technical features mentioned in the various embodiments can be combined in any manner.

When a component is considered to be "set on" another component, it may be located directly on the other component or there may be both centered components. When a component is considered to be "attached" to another component, it may be attached directly to the other component or there may be both centered components.

It is understood that the term "perpendicular" is used to describe the ideal state between two components. In the actual state of production or use, there may be a state of near-perpendicularity or equivalence between the two parts. For example, in conjunction with a numerical description, perpendicular may refer to a straight line with an angle between the two lines in the range of 90°±10°, perpendicular may refer to a dihedral angle between the two planes in the range of 90°±10°, and perpendicular may refer to a straight line with an angle between the two lines and the planes in the range of 90°±10°. The two parts described as "perpendicular" may not be absolutely straight or plane, but may also be roughly straight or plane, from a macroscopic point of view, the overall extension direction is straight or plane can be regarded as the parts for "straight" or "plane".

Unless otherwise defined, the term "plurality" herein, when used to describe the number of components, specifically means that the components are two or more.

Figure 1:
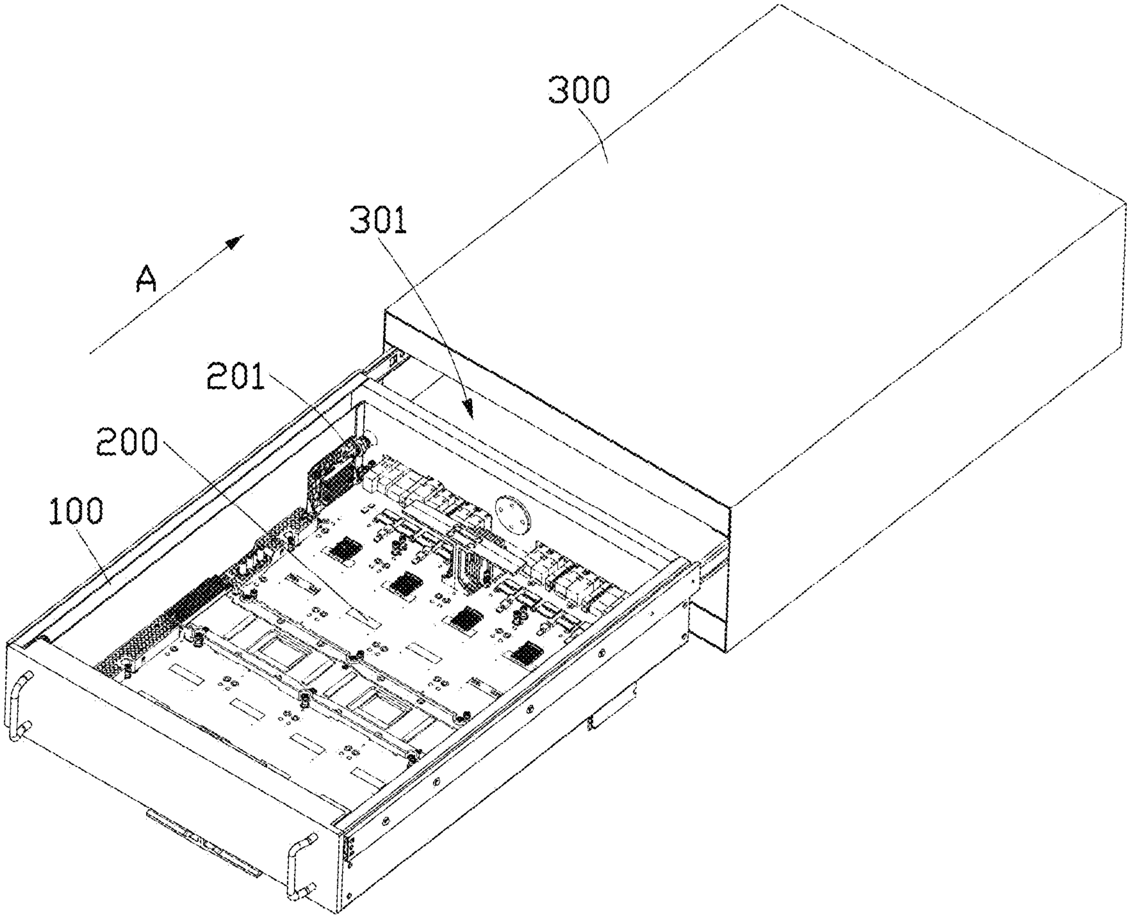
FIG. 1 shows a schematic view of a cabinet, a chassis, and a cabinet provided in an embodiment of the present application.
Figure 2:
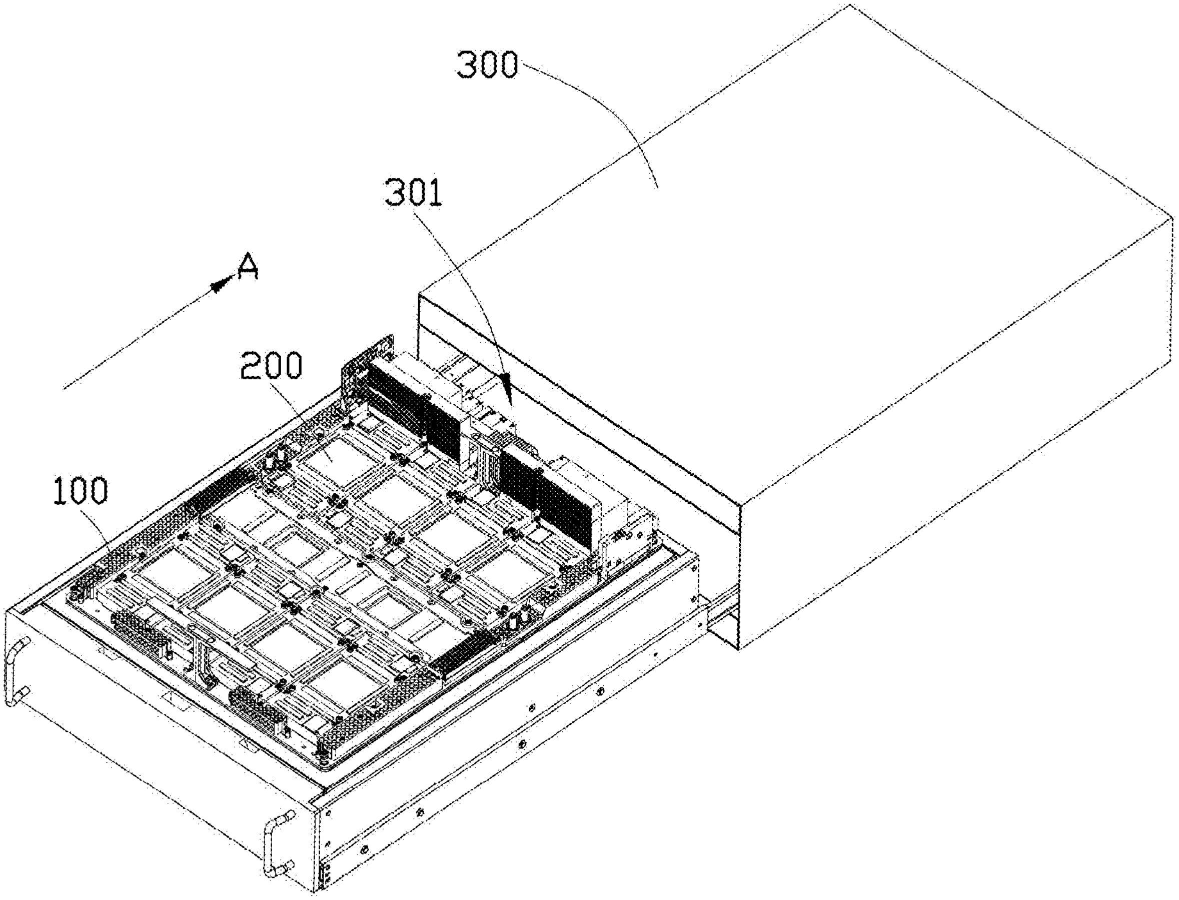
FIG. 2 is a schematic view the cabinet, chassis, and cabinet shown in FIG. 1, viewed from another angle.

Referring to FIG. 1 and FIG. 2, an embodiment of the present application provides a cabinet 300. The cabinet 300 includes a plurality of mounting positions 301 (only one mounting position 301 is shown), each mounting position 301 for mounting a reversible chassis 100, and each reversible chassis 100 is mounted with a cabinet 200. The cabinet 300 is provided with a plurality of first connectors (not shown), with each cabinet 200 is connected to other cabinets 300 or electronic devices (e. g., storage devices, etc.) via the first connectors. In other embodiments, the reversible chassis 100 may be configured for mounting other electronic devices, e. g., hardware devices such as network switches, industrial computers, and the like.

Figure 3:
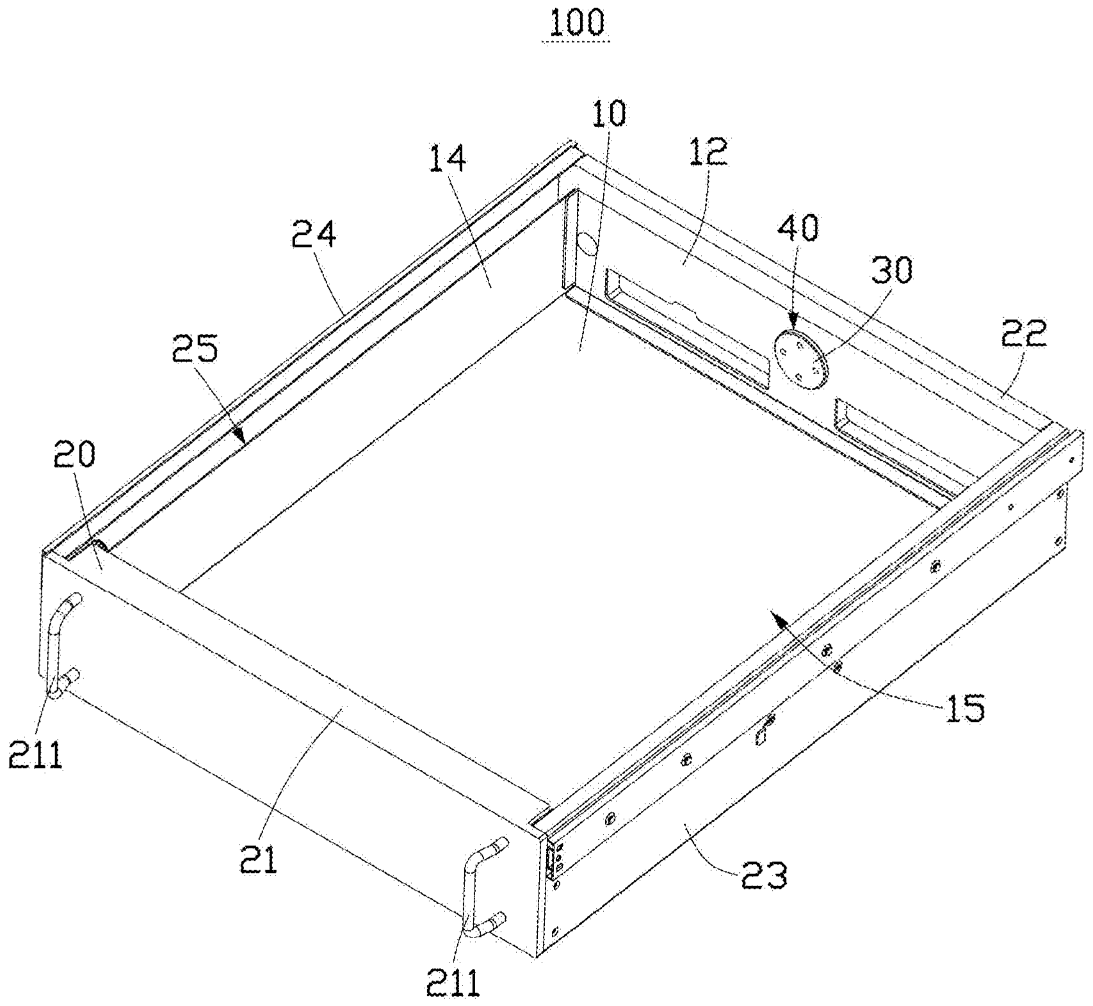
FIG. 3 shows a schematic view of a chassis provided in an embodiment of the present application.

Referring to FIG. 3, the reversible chassis 100 includes an inner frame 10, an outer frame 20, a plurality of rotating member 30, and a recessed structure 40. The inner frame 10 is configured for mounting the cabinet 200, the outer frame 20 is set outside the inner frame 10, and the outer frame 20 is capable of being movably set at the mounting position 301 of the cabinet 300 along the predefined direction A (refer to FIG. 1). The rotating member 30 is adapted to fit with the recessed structure 40, and the rotating member 30 is set outside the inner frame 10, and the recessed structure 40 is set inside the outer frame 20. The rotating member 30 is disposed on an outer side of the inner frame 10, and the recessed structure 40 is disposed on an inner side of the outer frame 20. A portion of the plurality of rotating member 30 is rotatably accommodated in the recessed structure 40, such that the inner frame 10 is rotatable relative to the outer frame 20. In other embodiments, the rotating member 30 is disposed on the inner side of the outer frame 20, the recessed structure 40 is disposed on the outer side of the inner frame 10.

Figure 4:
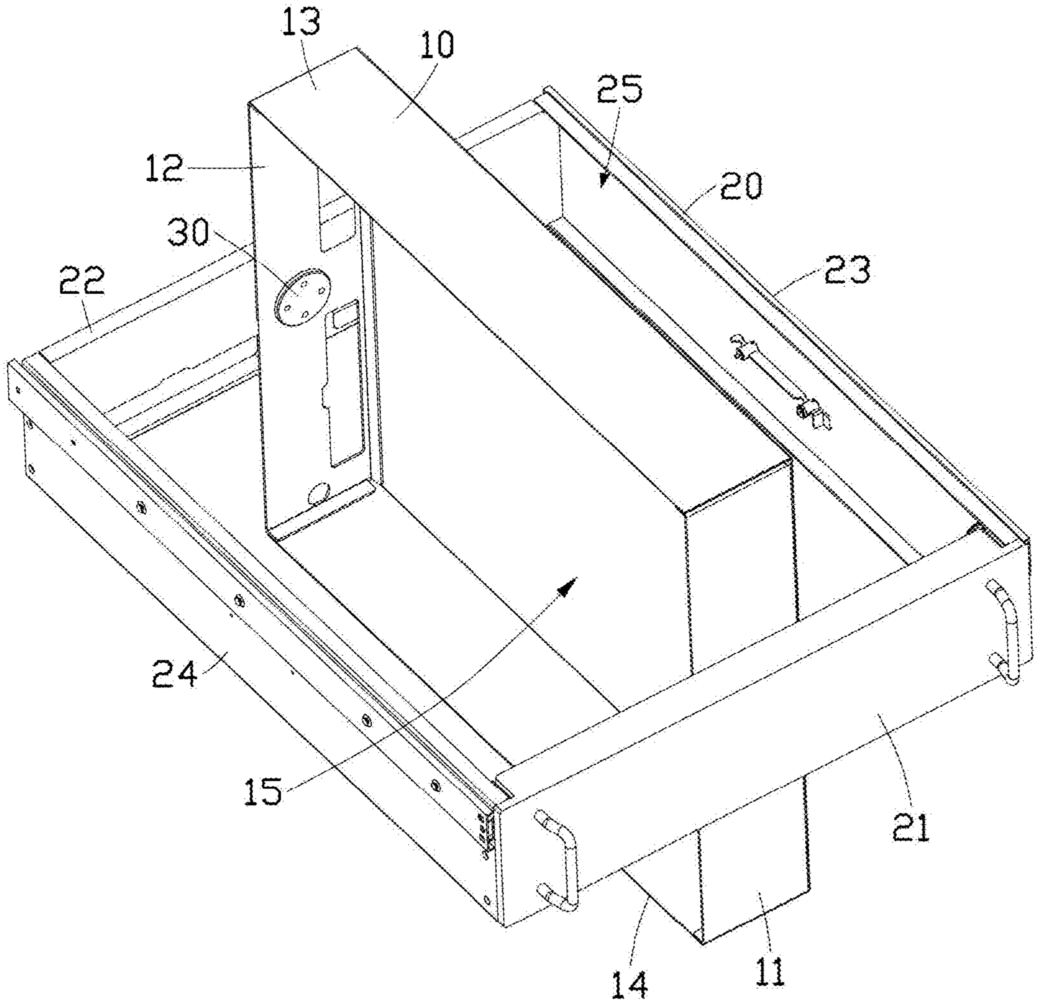
FIG. 4 shows a schematic view of an inner frame of the chassis shown in FIG. 3 during rotation.
Figure 5:
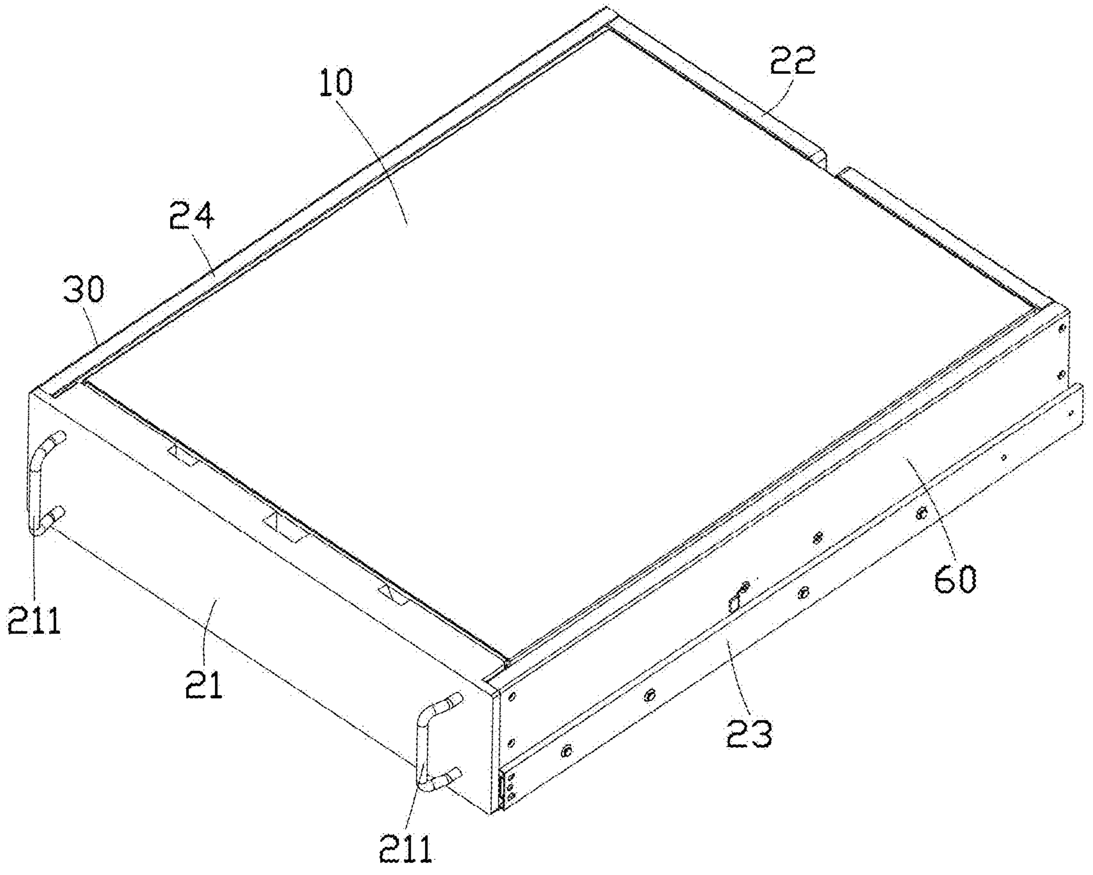
FIG. 5 shows a schematic view of the inner frame of the chassis shown in FIG. 3, after the chassis has been flipped over.

When the maintenance personnel needs to perform maintenance and management of the hardware components of the cabinet 200, the reversible chassis 100 and the cabinet 200 installed in the reversible chassis 100 are first withdrawn from the mounting positions 301 of the cabinet 300 along the predetermined direction A, so that the front side of the cabinet 200 is facing toward the maintenance personnel, and the maintenance personnel can perform inspection and maintenance on the front side of the cabinet 200. Next, as shown in FIG. 3, FIG. 4, and FIG. 5, the inner frame 10 is rotated relative to the outer frame 20, so that the reverse side of the cabinet 200 faces the maintenance personnel, and the maintenance personnel can inspect and maintain the back side of the cabinet 200. In this way, by rotating the inner frame 10 relative to the outer frame 20, the inspection and maintenance can be completed without removing the entire reversible chassis 100 from the cabinet 300, thereby simplifying the operation process, saving time and labor, and also reducing the risk of collision damage due to removing and placing back, and improving the efficiency and safety of the maintenance of the cabinet 200.

As shown in FIG. 3 and FIG. 4, in this embodiment, the inner frame 10 is substantially box-shaped. The inner frame 10 includes a first inner end plate 11, a second inner end plate 12, a first inner side plate 13, and a second inner side plate 14. The first inner end plate 11 and the second inner end plate 12 are disposed spaced apart from each other. The first inner side plate 13 and the second inner side plate 14 are spaced apart from each other. The first inner side plate 13 is substantially vertically connected between the first inner end plate 11 and the second inner end plate 12. The second inner side plate 14 is connected substantially vertically between the first inner end plate 11 and the second inner end plate 12. The first inner end plate 11, the first inner side plate 13, the second inner end plate 12, and the second inner side plate 14 are collectively enclosed to form a first accommodation space 15. The first accommodation space 15 is configured for setting up the cabinet 200.

As shown in FIG. 3 and FIG. 5, in this embodiment, the outer frame 20 is substantially in the shape of a box. The outer frame 20 includes a first outer end plate 21, a second outer end plate 22, a first outer side plate 23, and a second outer side plate 24. The first outer end plate 21 and the second outer end plate 22 are provided at relatively spaced apart intervals. The first outer side plate 23 and the second outer side plate 24 are spaced apart from each other. The first outer side plate 23 is connected substantially vertically between the first outer end plate 21 and the second outer end plate 22. The second outer side plate 24 is connected substantially vertically between the first outer end plate 21 and the second outer end plate 22. The first outer end plate 21, the first outer side plate 23, the second outer end plate 22, and the second outer side plate 24 collectively enclose a second accommodation space 25. The inner frame 10 is disposed in the second accommodation space 25. A handle 211 is provided on the side of the first outer end plate 21 that is back from the second accommodation space 25, and the handle 211 is used to facilitate the maintenance personnel in pulling the outer frame 20, so as to allow the outer frame 20 to smoothly enter and exit the mounting location 301 along the preset direction A. The cabinet 200 is provided with a second connector 201 (see FIG. 1), which can pass through the second inner end plate 12 and the second outer end plate 22 and be connected to a first connector (not shown) on the cabinet 300 via a cable (not shown). In addition, the cabinet 200 can be rotated, so that the second connector 201 on the cabinet 200 has a shorter distance from the first connector on the cabinet 300, thereby facilitating the use of a shorter connecting cable to electrically connect the first connector and the second connector 201, saving costs and reducing signal transmission losses.

Figure 6:
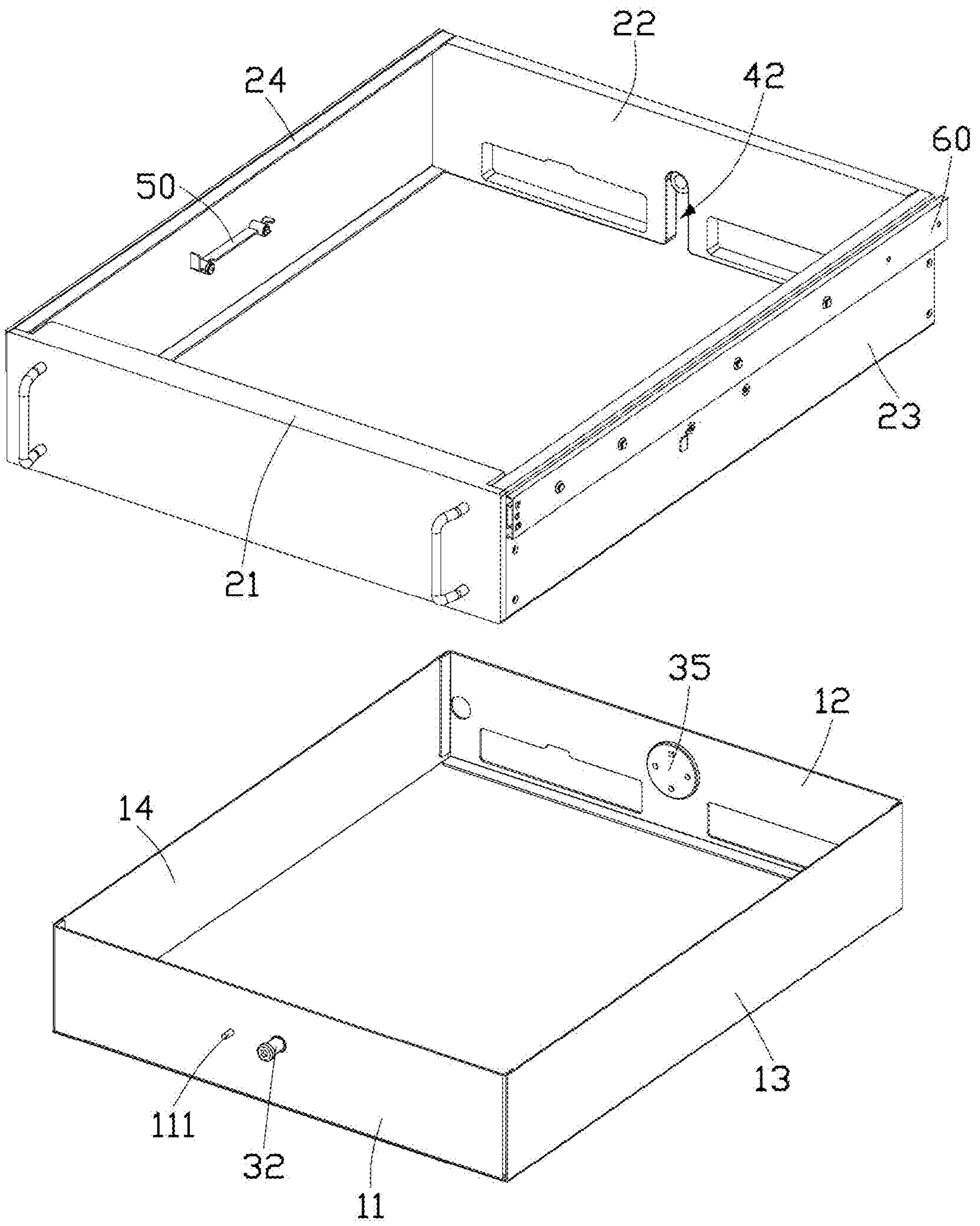
FIG. 6 shows an exploded view of the inner frame and an outer frame of the chassis shown in FIG. 3.

As shown in FIG. 5 and FIG. 6, in this embodiment, the rotating member 30 includes a first bearing 31 and a first rotating shaft 32. The first bearing 31 is disposed on the side of the first inner end plate 11 toward the first accommodation space 15, an end of the first rotating shaft 32 is inserted into the first bearing 31, and the other end of the first rotating shaft 32 rotatably passes through the first inner end plate 11. The recessed structure 40 includes a recess 41, the recess 41 is disposed on the side of the side of the first outer end plate 21 facing the second accommodation space 25, and the other end of the first rotating shaft 32 is rotatably accommodated in the recess 41. In this way, the inner frame 10 can realize the effect of rotating within the outer frame 20.

Figure 7:
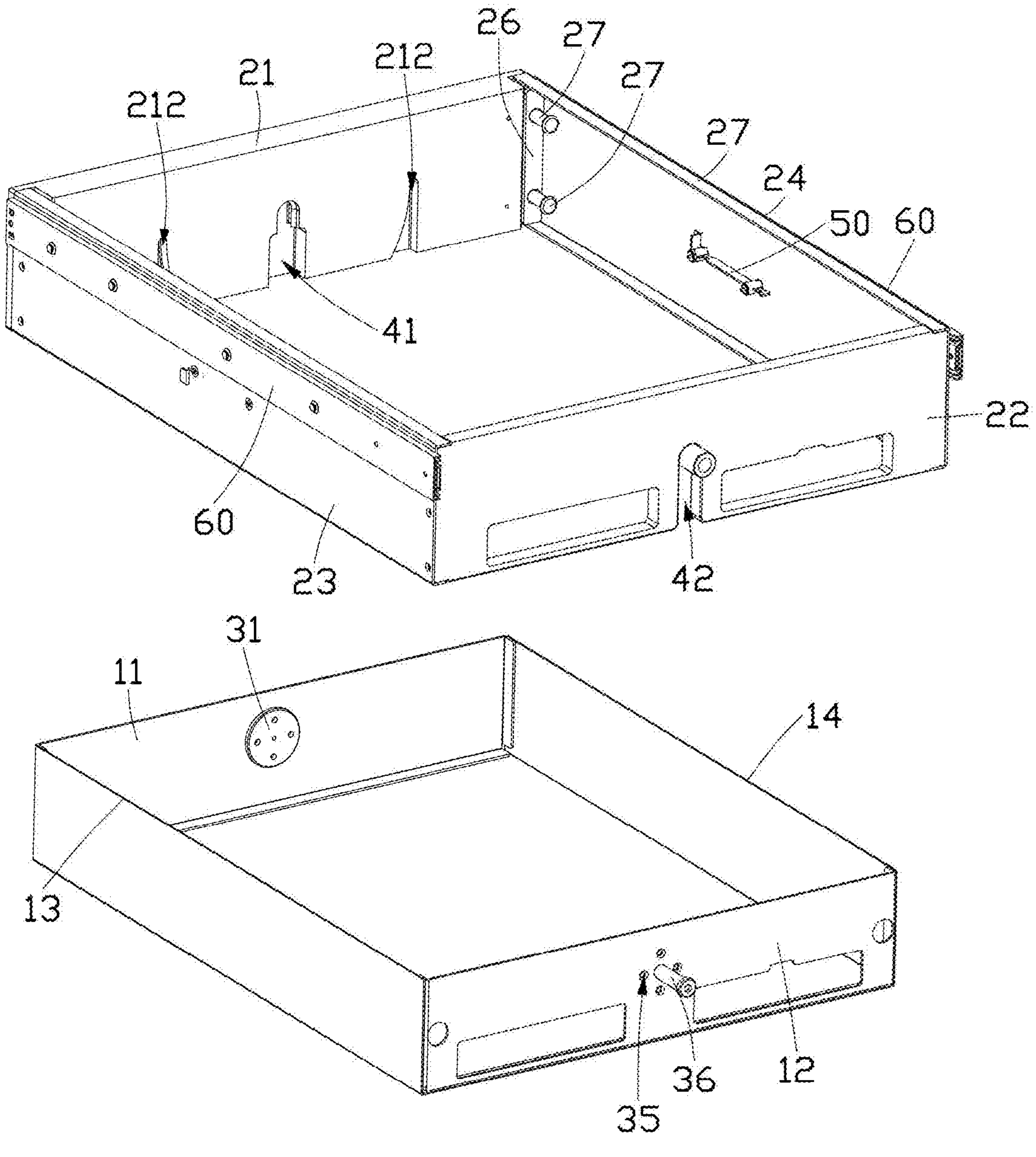
FIG. 7 shows another schematic view of the inner and the outer frames of the chassis shown in FIG. 3, viewed from another angle.
Figure 8:
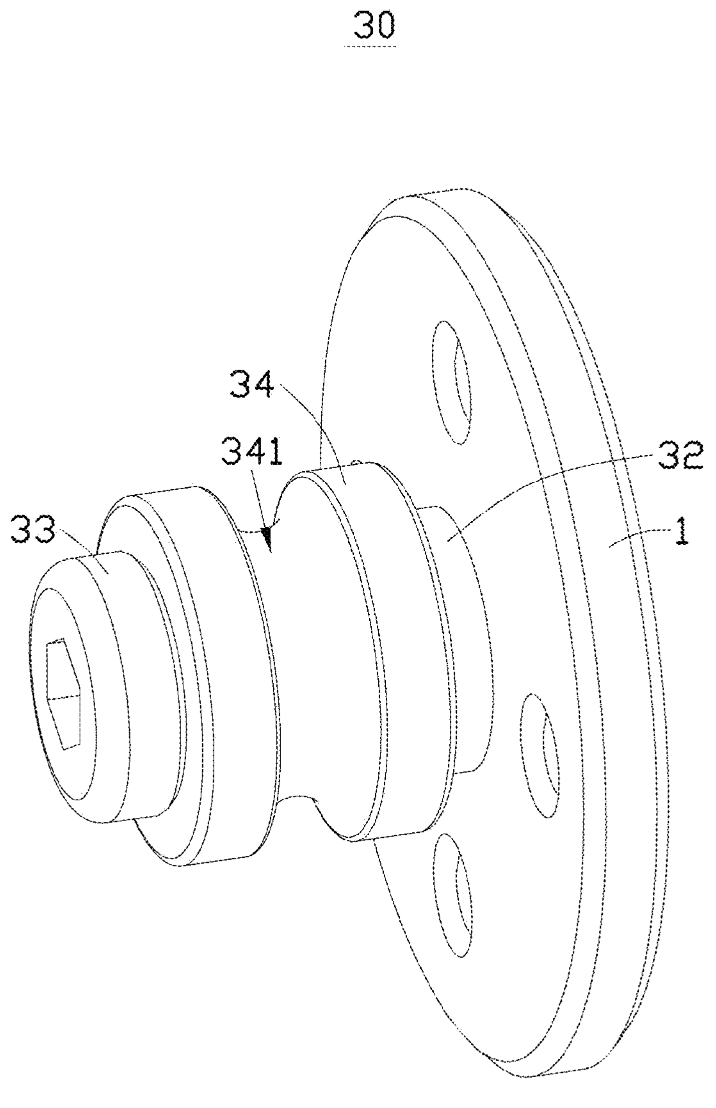
FIG. 8 shows a schematic view of a rotating member of the chassis shown in FIG. 3.

As shown in FIG. 6, FIG. 7, and FIG. 8, in this embodiment, the rotating member 30 further includes an anti-release screw 33 and a limiting portion 34. The limiting portion 34 is rotatably socketed to the other end of the first rotating shaft 32. The anti-release screw 33 is provided on an end face of the first rotating shaft 32. The anti-release screw 33 is used to hold the limit portion 34 against the limit portion 34 to prevent the limit portion 34 from disengaging from the first rotating shaft 32. The limiting portion 34 is provided with a groove 341, and the groove 341 is used to enable the limiting portion 34 to be snapped into the recess 41. In this way, during the process of the outer frame 20 entering and exiting the mounting position 301, the first outer end plate 21 is snapped with the first inner end plate 11 in the predetermined direction A, and no separation will occur.

As shown in FIG. 7, in this embodiment, the first outer end plate 21 is movably coupled to the first outer side plate 23 and the second outer side plate 24 along the preset direction A. The first outer side plate 23 and the second outer side plate 24 are each provided with a guide block 26. A guide post 27 is provided at each end of the first outer end plate 21. Along the preset direction A, the guide post 27 is movably disposed on the guide block 26. The outer frame 20 is pulled out of the installation for 301, the first outer end plate 21 pulls the inner frame 10 outwardly, causing the plug-in connector on the cabinet 200 to be separated from the connector on the cabinet 300, thereby contributing to reducing the risk of damage to the connector, and reducing the communication problem of the cabinet 200 due to the failure of the connector.

As shown in FIG. 6, in this embodiment, the rotating member 30 further includes a second bearing 35 and a second rotating shaft 36. The second bearing 35 is disposed on the side of the second inner end plate 12 toward the first accommodation space 15. Along the predetermined direction A, the second bearing 35 corresponds to the first bearing 31, one end of the second rotating shaft 36 is inserted into the second bearing 35, and the other end of the second rotating shaft 36 rotatably passes through the second inner end plate 12. Along the predetermined direction A, the first rotating shaft 32 corresponds to the second rotating shaft 36, and the recessed structure 40 further includes the aperture 42, which passes through the second outer end plate 22, and the other end of the second rotating shaft 36 rotatably accommodates in the aperture 42. The other end of the second rotating shaft 36 is rotatably accommodated in the aperture 42. By the cooperation of the first bearing 31 with the first rotating shaft 32, the second bearing 35, and the second rotating shaft 36, the inner frame 10 can be rotated smoothly and cohesively within the outer frame 20.

As shown in FIG. 5, in this embodiment, the first inner end plate 11 is provided with a limiting post 111 on the side back away from the first accommodation space 15. The limiting post 111 is spaced apart from the first rotation axis 32. The side of the first outer end plate 21 facing the second accommodation space 25 is provided with two limiting grooves 212. The two limiting grooves 212 are used to snap the limiting posts 111, thereby limiting the flip angle of the inner frame 10 relative to the outer frame 20. Further, the recess 41 is located at a midpoint of the two limit grooves 212, and the two limit grooves 212 are used to limit the flip angle of the inner frame 10 relative to the outer frame 20 from 0 degrees to 180 degrees.

As shown in FIG. 5 or FIG. 6, in this embodiment, the first outer side panel 23 and the second outer side panel 24 are each provided with a snap member 50 on the side facing the second accommodation space 25. The snap member 50 is used to snap the first inner side panel 13 and the second inner side panel 14. Specifically, the snap member 50 may be one of the types of a spring snap, a press snap, a swivel snap, a sliding snap, a winged snap, a hook snap, or a push-button snap, and so forth one type. The snap fastener 50 realizes a firm connection between the inner frame 10 and the outer frame 20 through various mechanical actions (e. g., spring force, pressing, rotating, sliding, etc.) to ensure that the stability and safety of the inner frame 10 is maintained during operation and use, thereby effectively avoiding shaking or falling off and safeguarding the safety of the cabinet 200.

As shown in FIG. 3, in this embodiment, the first outer side panel 23 and the second outer side panel 24 are each provided with a sliding member 60 on one side of the first outer side panel 23 and the second outer side panel 24 back from the second accommodating space 25, and the sliding member 60 is used to connect the cabinet 300. Specifically, the sliding member 60 may be one of the types of the roller sliding member, the slide sliding member, the ball sliding member, the linear sliding member, or the slider sliding member, and the like. The sliding member 60 realizes smooth entry and exit of the reversible chassis 100 in the cabinet 300 through various sliding mechanisms (e. g., roller, slide, ball, linear slide, etc.), ensures smooth and convenient operation, effectively reduces the risk of damage to the cabinet 200 caused by collision, and improves the efficiency and safety of installation and maintenance.

Those of ordinary skill in the art should recognize that the above embodiments are used only to illustrate the present application and are not intended to be used as a limitation of the present application, and that appropriate changes and variations to the above embodiments fall within the scope of the disclosure of the present application as long as they are made within the substantive spirit of the present application.

What is claimed is:

1. A reversible chassis comprising:

an inner frame, the inner frame comprising a first accommodation space, the first accommodation space is configured for setting up an electronic device; and an outer frame socketed outside the inner frame, the outer frame movably disposed in a cabinet in a predetermined direction, and comprising a second accommodation space configured for receiving the inner frame;

wherein the inner frame further comprises a plurality of rotating members on an outer side of the inner frame, the outer frame further comprises a recessed structure on an inner side of the outer frame, and a portion of the plurality of rotating members is rotatable accommodated in the recessed structure, the inner frame is configured to flip relative to the outer frame; each of the plurality of rotating members comprises a first bearing and a first rotating shaft, wherein the first bearing is disposed on a side of the inner frame towards the first accommodation space; an end of the first rotating shaft is inserted into the first bearing; the recessed structure comprises a recess disposed on a side of the outer frame toward the second accommodation space and corresponding to the first bearing, another end of the first rotating shaft plate is rotatably accommodated in the recess;

each of the plurality of rotating members further comprises an anti-release screw and a limiting portion; the limiting portion is rotatably socketed on the end of the first rotating shaft accommodated in the recess, the anti-release screw is on an end face of the first rotating shaft and configured for holding the limiting portion against the limiting portion, thereby preventing the limiting portion from disengaging from the first rotating shaft; the limiting portion defines a groove configured for enabling the limit portion to be seated in the recess.

2. The reversible chassis of claim 1, wherein the inner frame further comprises a first inner end plate, a second inner end plate, a first inner side plate, and a second inner side plate;

the first inner end plate and the second inner end plate are arranged at intervals, the first inner side plate and the second inner side plate are arranged at intervals;

the first inner side plate is disposed between the first inner end plate and the second inner side plate, the first inner side plate is connected to the first inner end plate and the second inner side plate;

the second inner side plate is disposed between the first inner end plate and the second inner end plate, the second inner side plate is disposed between the first inner end plate and the second inner end plate; and the first inner end plate, the first inner side plate, the second inner end plate and the second inner side plate are collectively enclosed to form the first accommodation space.

3. The reversible chassis of claim 2, wherein the outer frame further comprises a first outer end plate, a second outer end plate, a first outer side plate, and a second outer side plate;

the first outer end plate and the second outer end plate are arranged at intervals, the first outer side plate and the second outer side plate are arranged at intervals;

the first outer side plate is disposed between the first outer end plate and the second outer side plate, the first outer side plate is connected to the first outer end plate and the second outer side plate;

the second outer side plate is disposed between the first outer end plate and the second outer side plate, the second outer side plate is connected to the first outer end plate and the second outer side plate; and the first outer end plate, the first outer side plate, the second outer end plate, and the second outer side plate are collectively enclosed to form the second accommodation space.

4. The reversible chassis of claim 3, wherein the first bearing is disposed on a side of the first inner end plate towards the first accommodation space;

the other end of the first rotating shaft is rotatably accommodated through the first inner end plate;

the recess is disposed on a side of the first outer end plate side toward the second accommodation space.

5. The reversible chassis of claim 4, wherein the first outer end plate is movably coupled to the first outer side plate and the second outer side plate along the predetermined direction.

6. The reversible chassis of claim 5, wherein each of the first outer side plate and the second outer side plate is provided with a guide block, and the first outer end panel is provided with a guide post at each end, and the guide post is movably provided in the guide block along the predetermined direction.

7. The reversible chassis of claim 4, wherein the rotating member further comprises a second bearing and a second rotating shaft;

the second bearing is provided on a side of the second inner end plate towards the first accommodation space;

along the predetermined direction, the second bearing corresponding to the first bearing, an end of the second rotating shaft is inserted into the second bearing, another end of the second rotating shaft is rotatably accommodating the second inner end plate;

along the predetermined direction, the first rotating shaft corresponding to the second rotating shaft;

the recessed structure further comprises an aperture, the aperture penetrates the second outer end plate, the another end of the second rotating shaft is rotatably accommodated in the aperture.

8. The reversible chassis of claim 4, wherein the first inner end plate is provided with a limiting post on a side back from the first accommodation space, the limiting post and the first rotating shaft are arranged at intervals;

the first outer end plate is provided with two limiting grooves on the side towards the second accommodation space, the two limiting grooves are configured for holding the limiting post with a catch, thereby limiting an angle of reversal of the inner frame with respect to the outer frame.

9. The reversible chassis of claim 8, wherein the recess is located at the midpoint of two the limiting grooves, and the two the limiting grooves are configured for limiting a flip angle of the inner frame with respect to the outer frame to be 0 degrees to 180 degrees.

10. The reversible chassis of claim 4, wherein the first outer side plate and the second outer side plate are each provided with a snap fastener on a side towards the second accommodation space, the snap fastener is configured for holding the first inner side panel and the second inner side panel.

11. The reversible chassis of claim 4, wherein the first outer side plate and the second outer side plate are each provided with a sliding member on a side back from the second accommodation space, the sliding member is configured for connecting the cabinet.

12. A cabinet comprising:

a plurality of reversible chassis, each of the plurality of reversible chassis comprising:

an inner frame defining a first accommodation space and configured for setting up an electronic device;

an outer frame socketed outside the inner frame, the outer frame movably disposed in a cabinet in a predetermined direction and defining a second accommodation space configured for receiving the inner frame;

wherein the inner frame comprises a plurality of rotating members on an outer side of the inner frame, the outer frame comprises a recessed structure on an inner side of the outer frame, and a portion of the plurality of rotating members is rotatable accommodated in the recessed structure, the inner frame is configured to flip relative to the outer frame, wherein each of the plurality of rotating members comprises a first bearing and a first rotating shaft; the first bearing is disposed on a side of the inner frame towards the first accommodation space; an end of the first rotating shaft is inserted into the first bearing; the recessed structure comprises a recess disposed on a side of the outer frame toward the second accommodation space and corresponding to the first bearing, another end of the first rotating shaft plate is rotatably accommodated in the recess; and wherein each of the plurality of rotating members further comprises an anti-release screw and a limiting portion rotatably socketed on the end of the first rotating shaft accommodated in the recess, the anti-release screw is on an end face of the first rotating shaft; the anti-release screw is configured for holding the limiting portion against the limiting portion, thereby preventing the limiting portion from disengaging from the first rotating shaft; the limiting portion defines a groove configured for enabling the limit portion to be seated in the recess;

the cabinet further comprises a plurality of mounting positions, each of the plurality of mounting position is provided with a connector, each of the plurality of reversible chassis is provided in one the mounting position, the connector is configured for connecting the electronic device within the chassis.

13. The cabinet of claim 12, wherein the inner frame further comprises a first inner end plate, a second inner end plate, a first inner side plate, and a second inner side plate;

the first inner end plate and the second inner end plate are arranged at intervals, the first inner side plate and the second inner side plate are arranged at intervals;

the first inner side plate is disposed between the first inner end plate and the second inner side plate, the first inner side plate is connected to the first inner end plate and the second inner side plate;

the second inner side plate is disposed between the first inner end plate and the second inner end plate, the second inner side plate is disposed between the first inner end plate and the second inner end plate; and the first inner end plate, the first inner side plate, the second inner end plate and the second inner side plate are collectively enclosed to form the first accommodation space.

14. The cabinet of claim 13, wherein the outer frame further comprises a first outer end plate, a second outer end plate, a first outer side plate, and a second outer side plate;

the first outer end plate and the second outer end plate are arranged at intervals, the first outer side plate and the second outer side plate are arranged at intervals;

the first outer side plate is disposed between the first outer end plate and the second outer side plate, the first outer side plate is connected to the first outer end plate and the second outer side plate;

the second outer side plate is disposed between the first outer end plate and the second outer side plate, the second outer side plate is connected to the first outer end plate and the second outer side plate; and the first outer end plate, the first outer side plate, the second outer end plate, and the second outer side plate are collectively enclosed to form the second accommodation space.

15. The cabinet of claim 14, wherein the first bearing is disposed on a side of the first inner end plate towards the first accommodation space;

the other end of the first rotating shaft is rotatably accommodated through the first inner end plate;

the recess is disposed on a side of the first outer end plate side toward the second accommodation space.

16. The cabinet of claim 15, wherein the first outer end plate is movably coupled to the first outer side plate and the second outer side plate along the predetermined direction.

17. The cabinet of claim 16, wherein each of the first outer side plate and the second outer side plate is provided with a guide block, and the first outer end panel is provided with a guide post at each end, and the guide post is movably provided in the guide block along the predetermined direction.

18. The cabinet of claim 15, wherein the rotating member further comprises a second bearing and a second rotating shaft;

the second bearing is provided on a side of the second inner end plate towards the first accommodation space;

along the predetermined direction, the second bearing corresponding to the first bearing, an end of the second rotating shaft is inserted into the second bearing, another end of the second rotating shaft is rotatably accommodating the second inner end plate;

along the predetermined direction, the first rotating shaft corresponding to the second rotating shaft;

the recessed structure further comprises an aperture, the aperture penetrates the second outer end plate, the another end of the second rotating shaft is rotatably accommodated in the aperture.

* * * * *